United States Patent
Schwartz et al.

(10) Patent No.: US 8,482,908 B2
(45) Date of Patent: Jul. 9, 2013

(54) ELECTRONIC METER REGISTER AND METHOD HAVING A BOTTOM FORMED BY SEALING MATERIAL

(75) Inventors: Dennis W. Schwartz, West Bend, WI (US); Eric Metzger, Franklin, WI (US); John A. Olson, Brookfield, WI (US); Ronald D. Benson, Colgate, WI (US); Eric Tabaska, South Milwaukee, WI (US)

(73) Assignee: Badger Meter, Inc., Milwaukee, WI (US)

( * ) Notice: Subject to any disclaimer, the term of this patent is extended or adjusted under 35 U.S.C. 154(b) by 137 days.

(21) Appl. No.: 13/273,426

(22) Filed: Oct. 14, 2011

(65) Prior Publication Data

US 2013/0094125 A1  Apr. 18, 2013

(51) Int. Cl.
*H05K 7/00* (2006.01)
*G01R 35/04* (2006.01)

(52) U.S. Cl.
USPC ............ 361/679.01; 324/74; 324/76.11; 361/659; 361/667; 361/672

(58) Field of Classification Search
None
See application file for complete search history.

(56) References Cited

U.S. PATENT DOCUMENTS

| | | | |
|---|---|---|---|
| 3,935,735 A | 2/1976 | Lee et al. | |
| 4,052,896 A | 10/1977 | Lee et al. | |
| 4,633,719 A | 1/1987 | Vander Heyden et al. | |
| 5,699,232 A | 12/1997 | Neidig et al. | |
| 5,825,303 A * | 10/1998 | Bloss et al. | 340/870.02 |
| 5,877,703 A | 3/1999 | Bloss, Jr. et al. | |
| 6,111,519 A | 8/2000 | Bloss, Jr. et al. | |
| 6,611,769 B2 * | 8/2003 | Olson | 702/45 |
| 6,919,507 B2 | 7/2005 | Topp et al. | |
| 6,954,144 B1 | 10/2005 | Kiser et al. | |
| 7,412,882 B2 | 8/2008 | Lazar et al. | |
| 7,746,246 B2 * | 6/2010 | Salser, Jr. | 340/870.02 |
| 2005/0066746 A1 | 3/2005 | Winter | |

FOREIGN PATENT DOCUMENTS

| | | |
|---|---|---|
| EP | 0 205 746 B1 | 1/1990 |
| EP | 1 493 998 A2 | 6/2004 |

OTHER PUBLICATIONS

Badger Meter Water Meters, All-Electronic E-Series Meter Provides Durability, Reliability and Sustained Accuracy, htttp://www.badgermeter.com/Water/Water-Meters/E-Series.aspx, Jul. 11, 2011, pp. 1-2.

* cited by examiner

*Primary Examiner* — Zachary M Pape
*Assistant Examiner* — Douglas Burtner
(74) *Attorney, Agent, or Firm* — Boyle Frederickson, S.C.

(57) ABSTRACT

A sealed electronic meter register with no moving parts and no bottom wall or bottom cover includes a casing of plastic with an open bottom. A viewing window is snap fitted into a top wall of the casing. A gasket is placed on top of an electronic numerical display and under the viewing window. The display is placed on top of a frame that is positioned face down into the casing. An electronic circuit board with the processing circuitry of the device is attached to the bottom of the frame. A polyurethane compound sealing material is deposited though a hole in the circuit board and onto the backside of the display. An epoxy-resin sealant is then deposited from the bottom of the housing to seal over everything in the housing to protect the components and provide an exposed bottom surface for the assembly.

16 Claims, 6 Drawing Sheets

ELECTRONIC METER REGISTER AND METHOD HAVING A BOTTOM FORMED BY SEALING MATERIAL

TECHNICAL FIELD

This invention relates to water metering equipment and to electronic meter registers.

DESCRIPTION OF THE BACKGROUND ART

In the field of water meters, a turbine, nutating disc, a compound meter, or other type of flow measuring device is positioned in a housing that is connected in a water supply line. This is a "water meter".

An instrument known as a "register" is disposed on the water meter, usually on top of the water meter in a casing of a type shown in Paese et al. U.S. Des. Pat. No. 347,592, issued Jun. 7, 1994. Inside the register enclosure is a device with a dial or an odometer, or both, for displaying a number of units of water, such as cubic feet or gallons, which has been consumed by a water utility customer. See, for example, the register described in Paese et al., U.S. Pat. No. 5,376,776, which discloses an odometer in a meter register.

It has been known to couple the movements of the flow responsive element in a water meter to a meter register by providing a moving magnetic element in the meter ("the wet side") and an element to detect rotation or other movement of the flow responsive element in the meter register ("the dry side"). This allows the register to be mounted on the meter in a non-invasive fashion.

In the southern United States, utility meters are often located outside of residential buildings, sometimes in subsurface enclosures called "pits." An example is illustrated and described in Cerny et al., U.S. Pat. No. 5,298,894, issued Mar. 29, 1994, and assigned to the assignee of the present invention. During rainy periods, these metering units may be subjected to extreme moisture conditions, and even submersion under water.

For durability and protection against intrusion of moisture, meter registers have been made with a glass lens, a metal bottom and a butyl rubber sealant as disclosed in Walding, Jr. et al., U.S. Pat. No. 6,928,728, issued Aug. 16, 2005. This meter register is a mechanical device, with moving plastic parts, such as a tabulating mechanism and with a dial or an odometer for displaying units of consumption for a utility, in this case, water.

Olson, U.S. Pat. No. 6,661,769, discloses an electronic, programmable meter register to detect such movements and to display flow quantities using a liquid crystal display (LCD). The register includes a magnetic pulse pickup to sense movements of the flow metering element. This register demonstrated increased use of plastic parts, but still used a metal bottom and a glass lens in some embodiments.

Another example of an electronic meter with no moving parts is disclosed in Olson et al., U.S. Pat. Pub. No. US2010/0321205 A1. This meter uses ultrasonic methods to sense flow in a flow stream, however, the sensors for the unit penetrate the fluid conduit.

There remains a need for an all-electronic, non-invasive, meter register with no moving parts, with improved resistance to moisture and which can be made with lower cost parts and assembled more efficiently than meter registers of the prior art.

SUMMARY OF THE INVENTION

This invention provides a sealed assembly for an electronic water meter register.

The invention provides an electronic water meter register with water-resistant features that permit installation of units in outdoor underground enclosures.

The invention provides an impact-resistant casing for the meter register that uses a durable sealing material to form a bottom of the casing instead of using a bottom cover or a portion of the casing to form the bottom. Therefore, no bottom cover is employed. The casing is open at the bottom, having no bottom casing portion, and exposing the durable sealant material, but without deleterious effects. This reduces the number of parts and provides resulting efficiencies and advantages in manufacturing the assembly and as well as operational advantages. This also allows certain magnetic sensors in the meter register to be positioned for improved detection of movements of a magnet that is moved by operation of the meter in response to flow of a fluid.

In a further aspect of the invention, the electronic visual display is sealed with a first body of softer, more resilient sealing material and the other parts of the register are sealed with a second body of a firmer, more durable sealing material to provide a complete seal to the bottom of the casing. This allows the electronic display to expand during operation due to heating and to contract upon cooling (thermal cycling) separate from the firmer, durable sealing material. The additional body of softer sealing material also cushions the visual display is the unit is inadvertently dropped or impacted.

In one detailed embodiment, a sealed electronic meter register assembly comprises a casing having a wall across a top side, and having a peripheral wall around a periphery of the casing that defines an open lower end; a transparent window disposed in the top wall of the casing; a circuit board disposed in the casing; an electronic numerical display disposed underneath the window; a frame supporting the electronic numerical display on the circuit board; and a body of sealant disposed in the casing in open areas around the circuit board and the electronic numerical display to seal the circuit board and a bottom portion of the electronic numerical display against intrusion of moisture and to provide a bottom sealed surface for the casing that is exposed to an environment in which the assembly is located.

A method of assembling such a sealed electronic meter register comprises: assembling a transparent window with a register casing to allow viewing of an electronic numerical display; positioning the register casing upside down; positioning a gasket against an underside of the transparent window, the gasket having an opening in a middle portion to allow viewing of the electronic numerical display; positioning the electronic numerical display against the gasket; positioning a frame to support the electronic numerical display, the frame having an open middle area to expose an underside of the electronic numerical display; positioning a circuit board on an underside of the frame, the circuit board having a hole in a central area of the circuit board; depositing a body of a sealant that is substantially water impervious in the casing in open areas around the circuit board and the electronic numerical display to seal the circuit board and a bottom of the electronic numerical display and to provide a bottom sealed surface for the casing that is exposed to an environment in which the assembly is located.

Other aspects of the invention, besides those discussed above, will be apparent to those of ordinary skill in the art from the description of the preferred embodiments which follows. In the description, reference is made to the accompanying drawings, which form a part hereof, and which illustrate examples of the invention.

DETAILED DESCRIPTION OF THE PREFERRED EMBODIMENT

Figure 1:
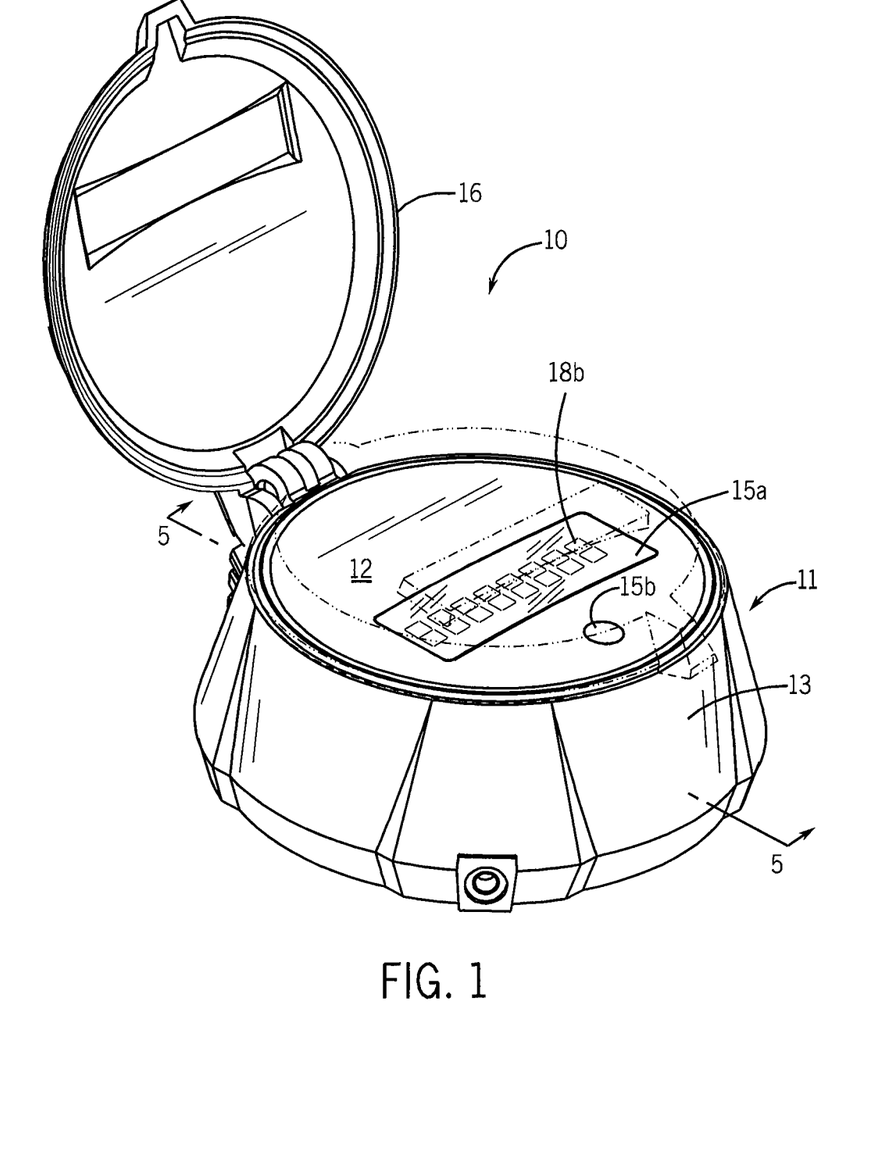
FIG. 1 is a top perspective view of a basic meter register assembly of the present invention with a lid of an outer casing having been lifted to an open position.
Figure 2:
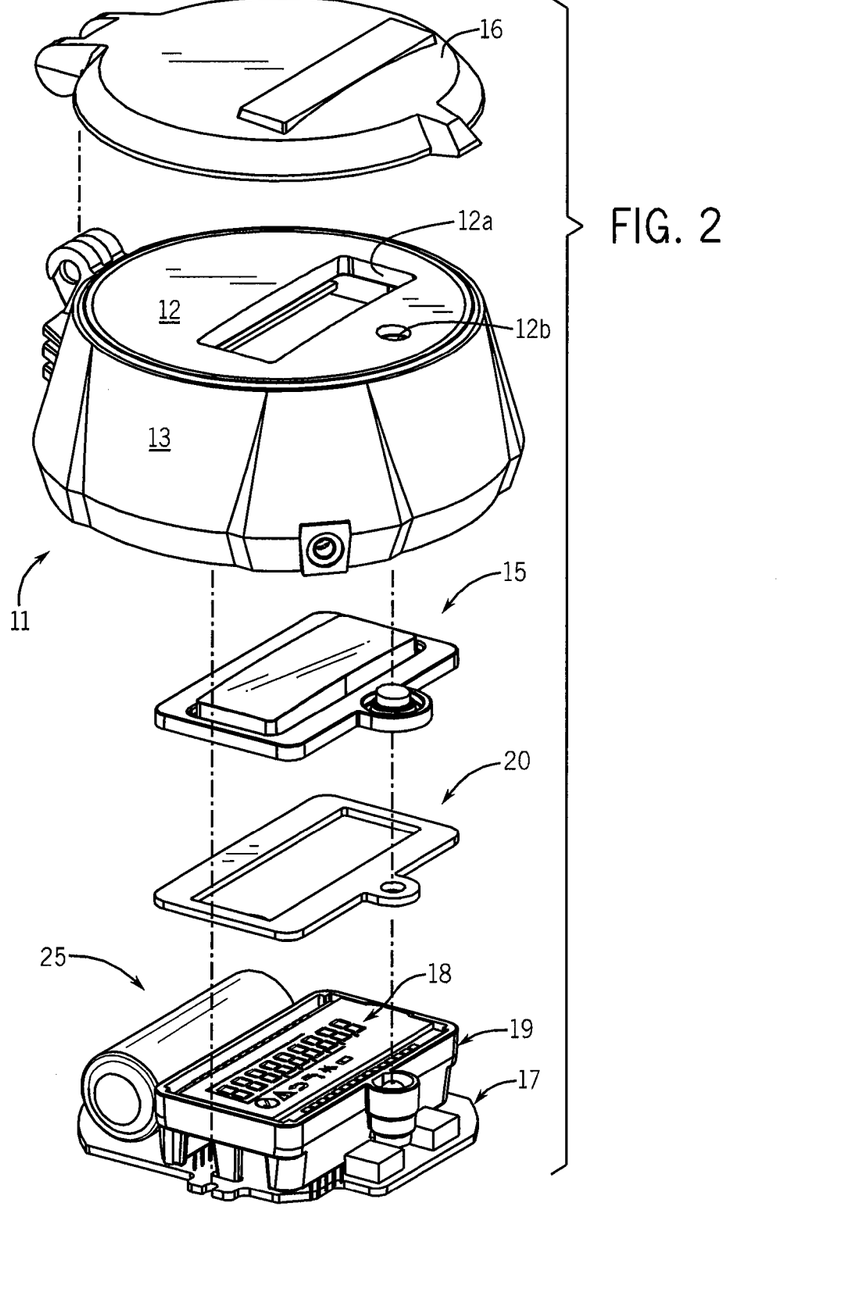
FIG. 2 is an exploded perspective view of the assembly of FIG. 1.

FIGS. 1 and 2 show a sealed electronic meter register assembly 10 for use in a subsurface in-ground enclosure of the type disclosed in Cerny et al., U.S. Pat. No. 5,298,894, issued Mar. 29, 1994.

Figure 3:
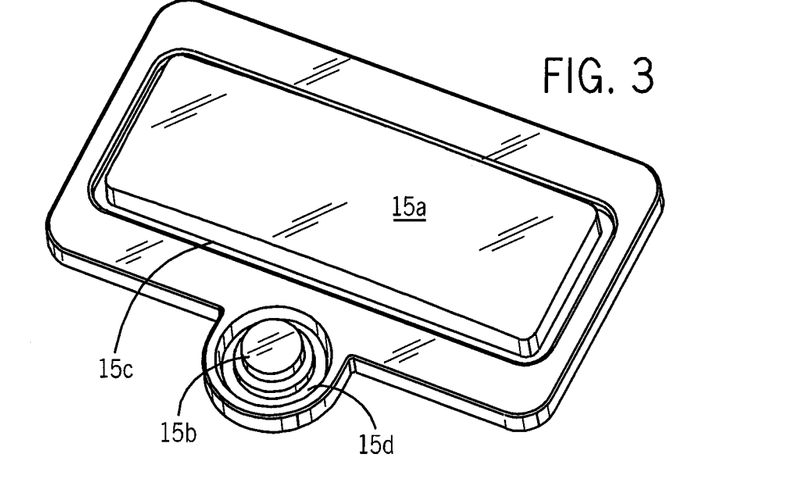
FIG. 3 is detail perspective view of a window element seen in FIG. 2.
Figure 4:
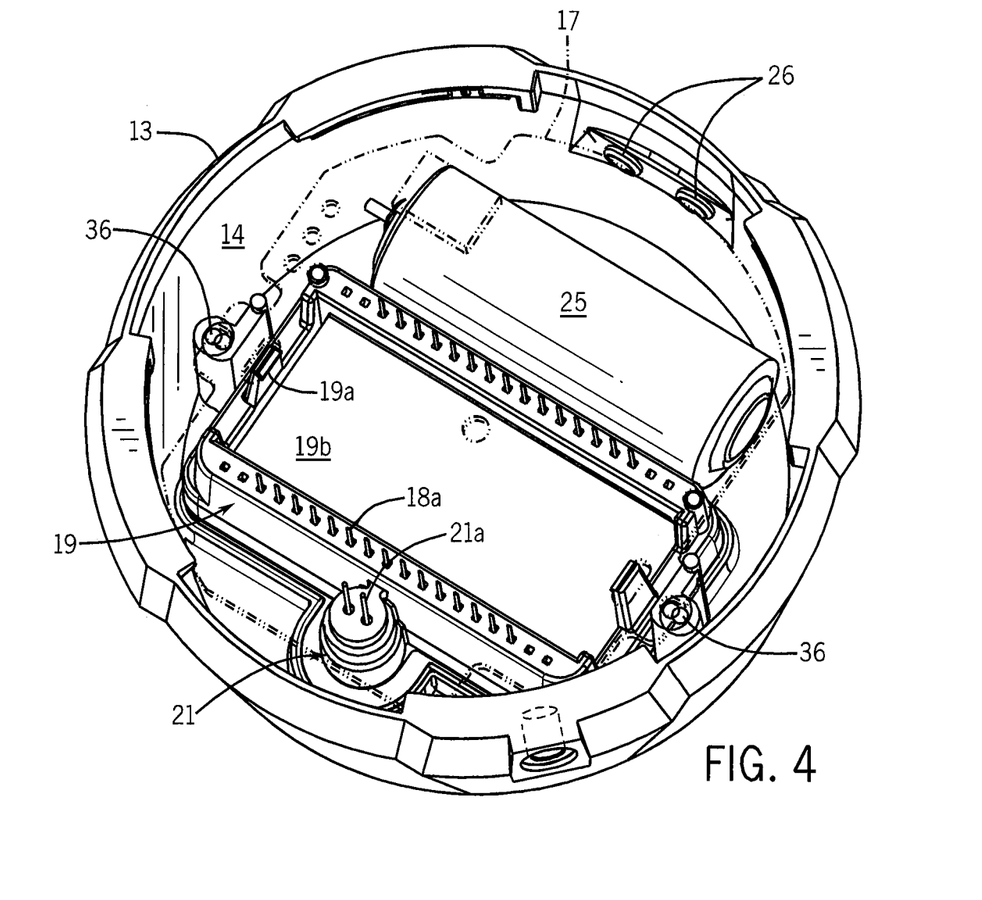
FIG. 4 is a bottom perspective view of register housing and electronics before sealing material is added during assembly.
Figure 6:
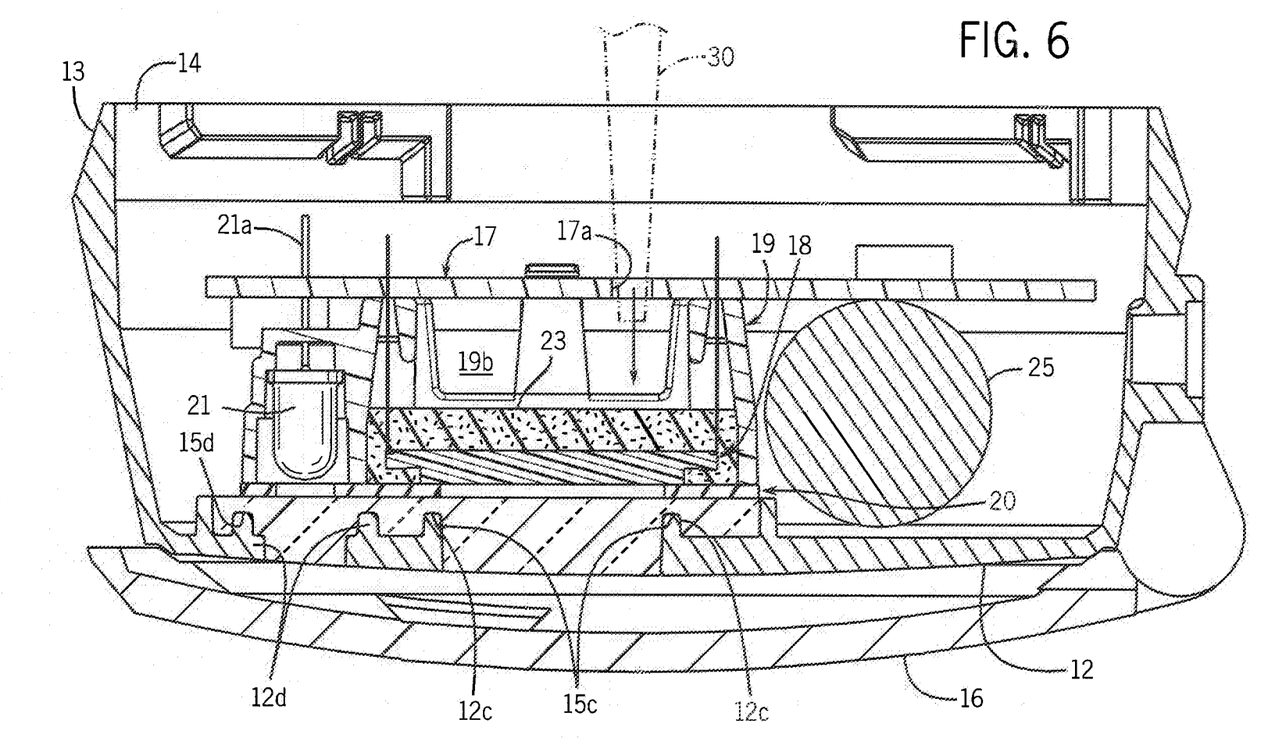
FIG. 6 is an inverted sectional view of the parts of FIG. 5, and showing a body of sealing material is positioned on a bottom side of a circuit board.
Figure 7:
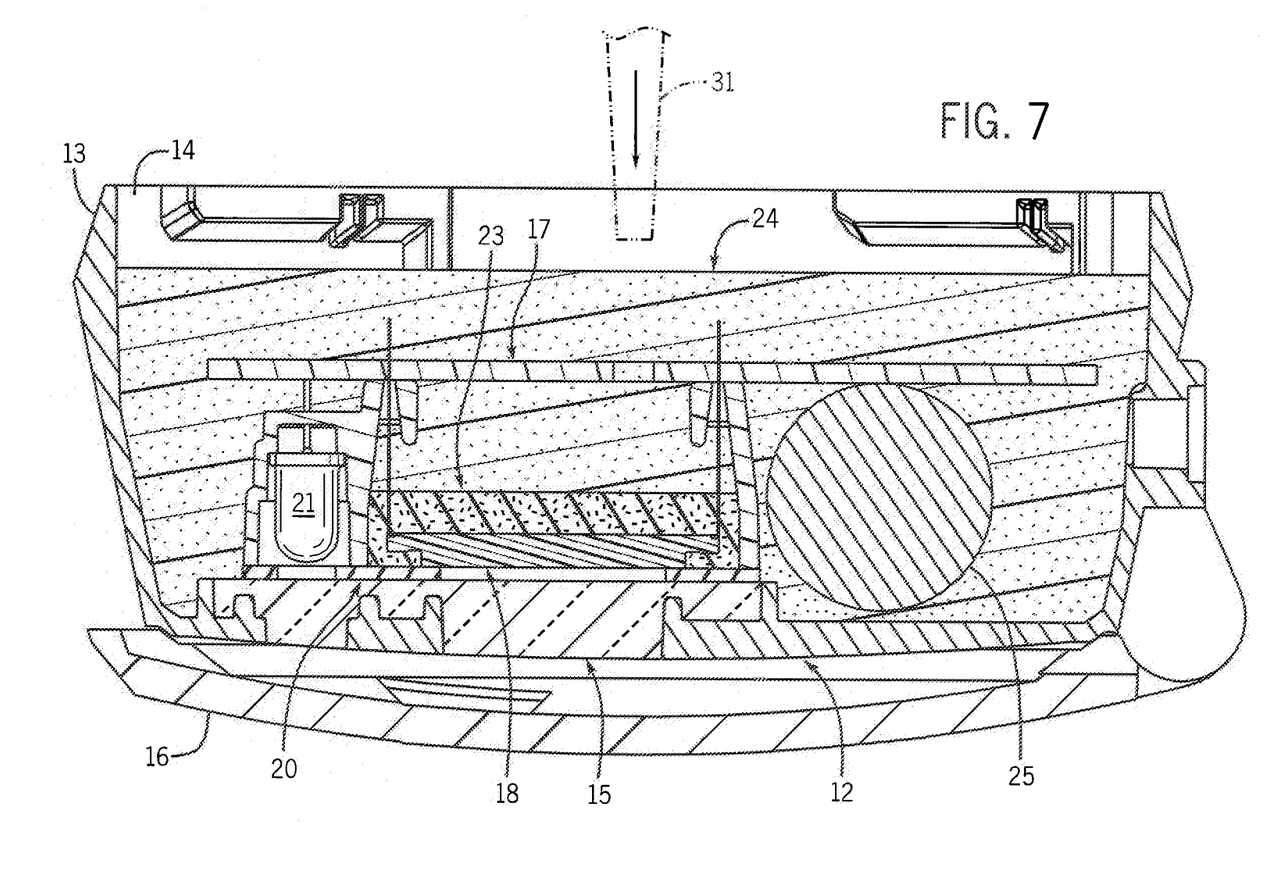
FIG. 7 is a sectional view from the same viewpoint as FIG. 6, during sealing of the electronic parts by a body of sealing material that forms a bottom of the assembly.

The assembly 10 includes a casing 11 having a top wall 12 across a top side, and having a peripheral wall 13 around a periphery of the casing that defines an open lower end 14 seen in FIGS. 4, 6 and 7. A transparent plastic window 15 fits into openings 12a, 12b in the top wall 12 of the casing 11. As seen in FIG. 3, the window 15 includes a circular portion 15b spaced from a main rectangular portion 15a. The window 15 has a rectangular groove 15c around the rectangular portion 15a and a circular groove 15d formed around the circular portion 15b. The top wall of the housing 12 forms downward projections 12c, 12d (FIG. 6) of corresponding shape and tight tolerances relative to the grooves 15c, 15d, so that the window 15 can be press fitted in place from an underside of the top wall 12 and still seal against moisture form the outside of the casing 11, without the addition of adhesives or sealants in this area.

A cover or lid 16 is pivotably mounted at a location on the periphery of the top wall 12. When closed, it protects the window portions 15a, 15b, of the assembly 10. The casing 11 and the lid 16 are made of a hard plastic material such as Noryl 731 thermoplastic from Sabic, which has a high degree of imperviousness to moisture.

Referring to FIGS. 3, 6 and 7, a circuit board 17 is disposed generally horizontally in the casing 11 and an electronic numerical display 18 is disposed underneath the window 15. A frame 19 is place underneath the electronic numerical display 18, the frame having legs 19a and having an open middle portion 19b. The frame 19 also receives pins 18a which are part of the electronic numerical display 18. Referring to FIG. 1, the display 18 may include both numeric and alphabetic symbols, but at a minimum includes numerical digits 18b (FIG. 1). The visual display 18 in this example is a liquid crystal display (LCD).

Also mounted on the circuit board 17 is a battery 25 which provides power to the circuit board 17 and to all electrical devices connected to it. The battery 25 is designed for long life and the circuit board 17 is designed to operate with low power requirements to assure the specified battery life which typically ten years or greater. The assembly 10 is designed for use in subsurface in-ground enclosure which is located apart from a residence and apart from any building electrical system.

Figure 5:
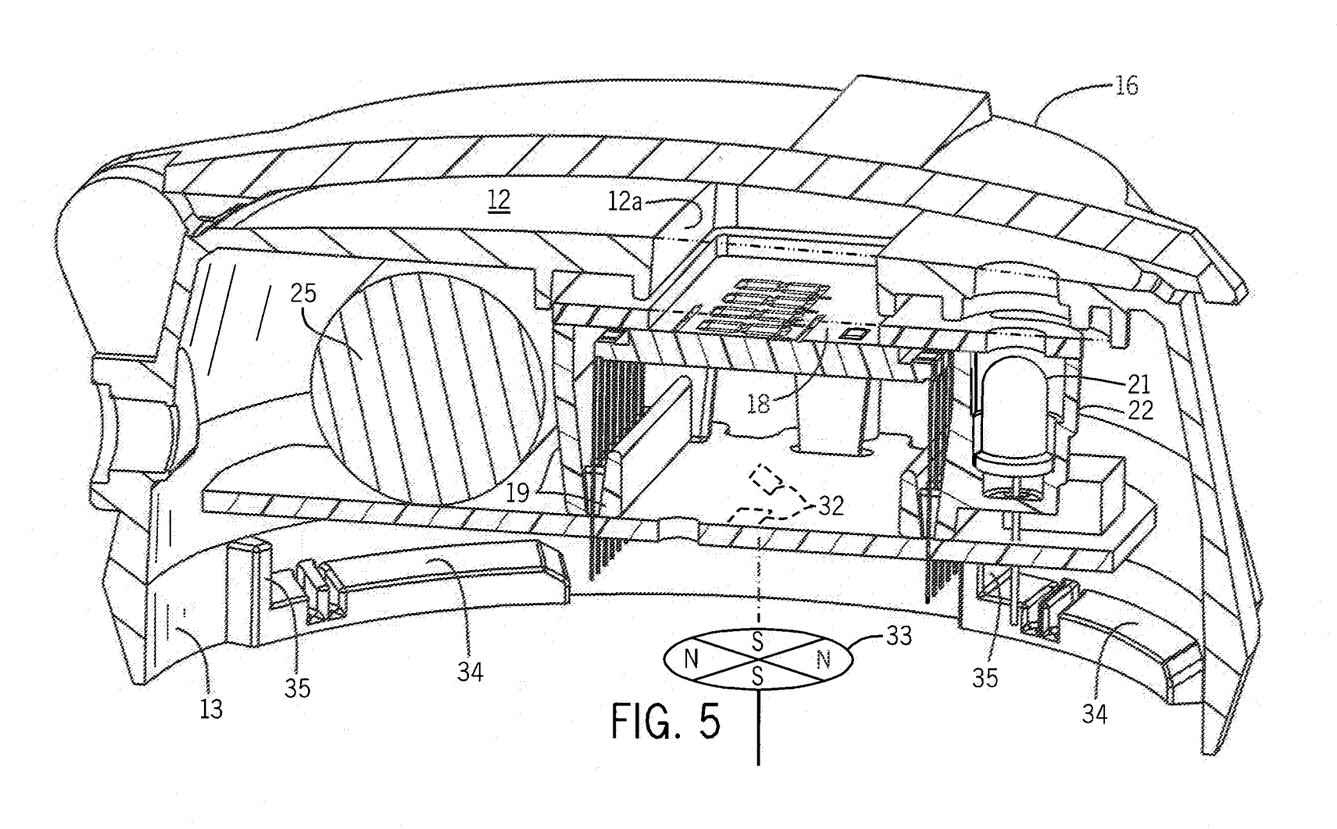
FIG. 5 is a sectional view of the assembly of FIG. 1, taken in the plane indicated by line 5-5 in FIG. 1.

Also, mounted on the circuit board 17 is an optical infrared frequency light emitting diode (LED) 21 which both receives optical data signals and transmits optical data signals to and from the circuit board 17. Programming commands and data parameters can be input through the small round window portion 15b and the optical element 21 and accumulated data and status signals can be received through the small window portion 15b from the optical element 21 using a handheld programming device (not shown) of a type known in the art. The optical element 21 is situated in its own small housing portion 22 integrated with the frame 19 as seen in FIG. 5.

In the prior art, it was typical for a meter register casing 11 to have a bottom wall of metal or plastic in contrast to the present invention where no bottom wall or bottom cover is necessary. As seen in FIGS. 4 and 6, the assembly 10 is positioned upside down and a first body of sealant 23 that is resilient and is disposed in the open middle portion 19b of the frame 19 in contact with the bottom of the electronic numerical display 18 where it protects the display from mechanical stress as a result of thermal cycling (heating and then cooling) during operation. The first sealant 23 is injected through a nozzle 30 which enters the open middle portion 19b of the frame 19 through a hole 17a in a central area of the circuit board 17 meaning an area corresponding to the open middle portion of the frame 19. The sealant 23 is allowed to cure, but it will remain resilient to protects the display from mechanical stress as a result of thermal cycling (heating and then cooling) during operation. It also protects the display 18 from stress if the assembly 10 is inadvertently dropped during shipping, handling or installation. The sealant formulation is two-part, low hardness aromatic polyurethane-compound sealing material, which will not deteriorate over heating and cooling cycles resulting from operation of the electronic visual display 18. Suitable formulations are available for Epic Resins and other suppliers known in the art.

A second body of sealant 24, which is a two-part epoxy-resin sealant, is disposed in the casing in open areas around the circuit board 17 and the electronic numerical display 18. This to seal the circuit board 17 and a bottom portion of the electronic numerical display 18 and to provide a bottom sealed surface for the casing 11 that is exposed to an environment in which the assembly is located. The sealant 24 should be able to resist cracks resulting from heating during operation of the electronic parts on the circuit board 17 and should be impervious to moisture that would cause malfunctioning of the electronic parts on the circuit board 17 and the electronic numerical display 18. This sealant 24 should provide good adhesion to plastic casing. Suitable formulations are available for Epic Resins and other suppliers known in the art.

This material 24 is injected through a nozzle 31 into the casing 11 from the bottom, with casing turned upside down as seen in FIG. 7. The sealant 24 will fill an interior cavity of the casing 11 around the battery, the frame 19 and the LED housing 22 and filling the open area of the frame 19 around the softer sealant 23 previously deposited.

As seen in FIGS. 2, 5, 6 and 7, a gasket 20 is disposed between a top portion of the electronic numerical display 18 and an underside of the window 15 to prevent any of the first body of resilient sealant 23 or the second body of sealant 24 from entering a space between the electronic numerical display 18 and the window 15.

As seen in FIG. 5, the circuitry on the circuit board 17 includes Hall-type sensors 32 (on the bottom of the circuit board 17) for detecting movements of north (N) and south (S)

poles of a magnet 33 on a moving body in the meter such as a turbine or nutating disc. The construction disclosed herein allows the Hall-type sensors 32 to be positioned closer to the magnet 33, which is an advantage in operation. The movements of the magnet 33 are converted by meter register detector circuit to electronic signals which are counted with a processor (not shown) and then converted to further signals in a communication protocol for communication through a wire that would be received through holes 26 (FIG. 4) in the periphery of the casing 11. The count is also converted to signals that are sent to the electronic visual display 18 for visual display to a customer or service technician.

The casing 11 has a wide bottom opening 14 in comparison with its height, for example, providing a low profile device with a height to width ratio of 1:1 or less. This provides a wide bottom surface to be formed by the sealant material 24 (FIG. 7). The lower edge of the peripheral wall 13 (FIG. 5) has interior ridges 34 and stops 35 that connect to projections on a top of a meter housing as illustrated in DeJarlais et al., U.S. Pat. No. 5,339,686, issued Aug. 23, 1994. The meter register 10 is attached by positioning the casing 11 on the top of the meter housing and then moving it with a rotational type motion. This has sometimes been characterized as a bayonet-type connection.

In a method of assembling a sealed electronic meter register assembly 10 that is configured for installation in a subsurface in-ground enclosure, the transparent window 15 is snap-fit assembled to the register casing 11 to allow viewing of an electronic numerical display 18. The casing 11 is then turned upside down and the gasket 20 is positioned on an underside of the transparent window 15, the gasket 20 having an opening in a middle portion to allow viewing of the electronic numerical display 18. Next, the electronic numerical display 18 which has its pins 18a, inserted through the frame 19 is positioned face down on the gasket 20 as seen in FIG. 4 and the frame 19 is secured to the circuit board 17 with screws 36 at locations seen in FIG. 4. The large middle open area 19b of the frame 19 is best seen in FIG. 4. Then, the circuit board 17 is positioned on an underside of the frame 19, the circuit board 17 having a hole 17a in a central area of the circuit board 17. The leads 18a, 21a from the display 18 and the LED 21 will be inserted into plated through-holes in the circuit board 17.

Then, a resilient sealant 23 is injected through a nozzle 30 in the hole 17a in the circuit board 17 into a middle portion 19b of the frame 19 to contact the bottom of the electronic numerical display 18 to seal, where it will support the electronic numerical display. The sealant is then cured. Then, a second body of sealant 24 that is substantially water impervious is injected via nozzle 31 in the casing in open areas around the circuit board and the electronic numerical display 18 to seal the circuit board 17 and a bottom of the electronic numerical display 18 and to provide a bottom sealed surface for the casing 11 that is exposed to an environment in which the assembly 10 is located. The second body of sealant 24 is an epoxy formed by mixing a resin part and a hardener part, and then depositing the material 24 in the casing 11 and allowing the material to cure and harden for a period of time as specified by the supplier. The assembly 10 is used with no bottom cover and no bottom wall covering the second body of sealant.

This allows the electronic display 18 to expand during operation due to heating and to contract upon cooling (thermal cycling) separate from the firmer, durable sealing material 24. The body of softer sealing material 23 also cushions the visual display if the unit is inadvertently dropped or impacted.

It can be seen from this description that the invention provides all electronic meter register assembly 10 with no moving parts, with improved resistance to moisture and with lower cost parts and manufacturing efficiencies when compared meter registers of the prior art.

This has been a description of a preferred embodiment, and it will be apparent to those of ordinary skill in the art that variations may be made in the details of these specific embodiments without departing from the scope and spirit of the present invention, and that such variations are intended to be encompassed by the following claims.

We claim:

1. A sealed electronic meter register assembly for use in a subsurface in-ground enclosure, the assembly comprising:
   a casing having a wall across a top side, and having a peripheral wall around a periphery of the casing that defines an open lower end;
   a transparent window disposed in the top wall of the casing;
   a circuit board disposed in the casing;
   an electronic numerical display disposed underneath the window;
   a frame supporting the electronic numerical display on the circuit board;
   a body of sealant disposed in the casing in open areas around the circuit board and the electronic numerical display to seal the circuit board and a bottom portion of the electronic numerical display against intrusion of moisture and to provide a bottom sealed surface for the casing that is exposed to an environment in which the assembly is located,
   wherein the frame is open in a middle portion; wherein the body of sealant is an epoxy-resin sealant, and further comprising a body of a second sealant that is resilient and that is disposed in the middle portion of the frame underneath the epoxy sealant.

2. The sealed electronic meter register assembly of claim 1 wherein the sealant that is resilient includes a polyurethane compound.

3. The sealed electronic meter register assembly of claim 1 wherein the epoxy-resin sealant material is a solid, substantially non-deformable, mixture of a resin and a hardener, that is substantially impervious to moisture after curing.

4. The sealed electronic meter register assembly of claim 1, further comprising a gasket disposed between a top portion of the electronic numerical display and an underside of the window to prevent any of the epoxy sealant and the body of the second sealant from entering a space between the electronic numerical display and the window.

5. The sealed electronic meter register assembly of claim 1, wherein the circuit board has a hole in a central area to permit injection of the body of resilient sealant and the body of epoxy-resin sealant into a space provided by the frame between a bottom side of the electronic display and top side of the circuit board.

6. The sealed electronic meter register assembly of claim 1, further comprising an optical element positioned laterally to one side of the electronic numerical display and visible through the window to receive and transmit data.

7. The sealed electronic meter register assembly of claim 6, wherein the transparent window has a circular portion extending laterally over said optical element.

8. The sealed electronic meter register assembly of claim 1, wherein the transparent window has a rectangular groove and a circular groove for receiving projections on the top wall of the casing with close tolerances providing a snap fit between the window and the top wall of the casing.

9. The sealed electronic meter register assembly of claim 1, wherein there is no bottom cover and no bottom wall covering the body of sealant.

10. The sealed electronic meter register assembly of claim 9, where there are no mechanical moving parts.

11. A method of assembling a sealed electronic meter register assembly that is configured for installation in a subsurface in-ground enclosure, the method comprising assembling a transparent window with a register casing to allow viewing of an electronic numerical display;

positioning the register casing upside down;

positioning a gasket on an underside of the transparent window, the gasket having an opening in a middle portion to allow viewing of the electronic numerical display;

positioning the electronic numerical display on the gasket;

positioning a frame to support the electronic numerical display, the frame having an open middle portion to expose an underside of the electronic numerical display;

positioning a circuit board on an underside of the frame, the circuit board having a hole in a central area of the circuit board;

depositing a body of a sealant that is substantially water impervious in the casing in open areas around the circuit board and the electronic numerical display to seal the circuit board and a bottom of the electronic numerical display and to provide a bottom sealed surface for the casing that is exposed to an environment in which the assembly is located, wherein before depositing the body of sealant, depositing another body of resilient sealant into a middle portion of the frame into contact with the bottom of the electronic numerical display where the resilient sealant protects the electronic numerical display from mechanical stress resulting from thermal cycling.

12. The method of claim 11, wherein the other body of resilient sealant includes a polyurethane compound.

13. The method of claim 12, wherein the body of resilient sealant is injected through a hole in the circuit board.

14. The method of assembling a sealed electronic meter register assembly according to claim 11, wherein the body of sealant is formed by mixing an epoxy resin part and a hardener part, and then depositing the material in the casing and allowing the material to cure for a period of time.

15. The method of assembling a sealed electronic meter register assembly according to claim 11, wherein there is no bottom cover and no bottom wall covering the body of sealant.

16. The method of claim 15, where there are no mechanical moving parts assembled as part of the assembly.

* * * * *